US005908506A

United States Patent [19]

Olson et al.

[11] Patent Number: 5,908,506

[45] Date of Patent: Jun. 1, 1999

[54] CONTINUOUS VAPOR DEPOSITION APPARATUS

[75] Inventors: Roger Allen Olson, Amery, Wis.; Frederick William Kopitzke, III, Indianapolis; Joseph Patrick O'Connor, Carmel, both of Ind.

[73] Assignee: Specialty Coating Systems, Inc., Indianapolis, Ind.

[21] Appl. No.: 08/728,669

[22] Filed: Oct. 10, 1996

Related U.S. Application Data

[60] Continuation of application No. 08/449,991, May 25, 1995, abandoned, which is a division of application No. 08/129,291, Sep. 30, 1993, Pat. No. 5,424,097.

[51] Int. Cl.[6] .................................................. C23C 16/00

[52] U.S. Cl. ......................... 118/708; 118/712; 118/719; 427/8; 427/10; 427/255.5; 427/255.6; 427/255.7

[58] Field of Search .................................. 118/708, 712, 118/719; 427/8, 10, 255.5, 255.6, 255.7

[56] References Cited

U.S. PATENT DOCUMENTS

| | | |
|---|---|---|
| 3,211,128 | 10/1965 | Potter et al. . |
| 3,246,627 | 4/1966 | Loeb et al. . |
| 3,301,707 | 1/1967 | Loeb et al. . |
| 3,472,795 | 10/1969 | Tittmann . |
| 3,554,512 | 1/1971 | Elliott . |
| 3,570,449 | 3/1971 | Blecherman . |
| 3,573,968 | 4/1971 | Loeb . |
| 3,600,216 | 8/1971 | Stewart . |
| 3,667,424 | 6/1972 | Cornelius et al. . |
| 3,670,693 | 6/1972 | Rorick et al. . |
| 3,747,558 | 7/1973 | Harel . |
| 3,749,601 | 7/1973 | Tittle . |
| 4,047,624 | 9/1977 | Dorenbos ................................ 118/719 |
| 4,110,392 | 8/1978 | Yamazaki . |
| 4,184,188 | 1/1980 | Briglia . |
| 4,261,762 | 4/1981 | King . |
| 4,323,031 | 4/1982 | Kaplan . |
| 4,362,125 | 12/1982 | Schadler . |
| 4,401,052 | 8/1983 | Baron et al. . |
| 4,468,283 | 8/1984 | Ahmed . |
| 4,495,889 | 1/1985 | Riley . |

(List continued on next page.)

FOREIGN PATENT DOCUMENTS

| | | |
|---|---|---|
| 0 102 417 A1 | 3/1984 | European Pat. Off. . |
| 0 434 227 A1 | 6/1991 | European Pat. Off. . |
| 0 679 373 A2 | 11/1995 | European Pat. Off. . |
| 650947 | 3/1951 | United Kingdom . |
| WO 82/03069 | 9/1982 | WIPO . |

OTHER PUBLICATIONS

L. You, et al., Chemical Perspectives of Microelectric Materials III Symposium (1992) (Abstract Only).

Chow, S.W., "Poly (α,α,α',α',–tetrafluoro–p–xylylene)", *Journal of Applied Polymer Science,* vol. 13, pp. 2325–2332, 1969.

Mikami Takashi, "Quartz Crystal Oscillator Type Radical Beam Monitor", *Patent Abstracts of Japan,* Patent No 07050258.

International Search Report.

*Primary Examiner*—Richard Bueker

*Attorney, Agent, or Firm*—Mintz, Levin, Cohn, Ferris, Glovsky and Popeo, P. C.

[57] ABSTRACT

Continuous vapor deposition apparatus for coating objects with a coating material, e.g., parylene, are disclosed. The apparatus comprise an entrance chamber for loading the objects, a process chamber for coating the objects, and an exit chamber for removing the objects. Coating material is introduced into the process chamber under vacuum conditions in a vaporized state. The pressure in the process chamber can be controlled by modulating the rate of introduction of the coating material with a modulating valve in response to the pressure in the process chamber. A process for continuously coating objects by vapor deposition under vacuum conditions, suitable for use in the apparatus, is also disclosed.

20 Claims, 1 Drawing Sheet

U.S. PATENT DOCUMENTS

| | | | |
|---|---|---|---|
| 4,508,055 | 4/1985 | Elton et al. . | |
| 4,518,623 | 5/1985 | Riley . | |
| 4,577,465 | 3/1986 | Olsen et al. . | |
| 4,596,208 | 6/1986 | Wolfson et al. . | |
| 4,613,306 | 9/1986 | Bauer et al. . | |
| 4,619,844 | 10/1986 | Pierce et al. . | |
| 4,683,143 | 7/1987 | Riley | 427/8 |
| 4,734,533 | 3/1988 | Ungarelli et al. . | |
| 4,761,269 | 8/1988 | Conger et al. . | |
| 4,783,561 | 11/1988 | Pregaglia et al. . | |
| 4,795,838 | 1/1989 | Bornengo et al. . | |
| 4,816,608 | 3/1989 | Bornengo et al. . | |
| 4,817,557 | 4/1989 | Diem | 118/719 |
| 4,846,998 | 7/1989 | Phol et al. . | |
| 4,853,488 | 8/1989 | Ungarelli et al. . | |
| 4,877,433 | 10/1989 | Oshitari . | |
| 4,883,020 | 11/1989 | Kasai et al. . | |
| 4,886,923 | 12/1989 | Ungarelli et al. . | |
| 4,902,572 | 2/1990 | Horne et al. . | |
| 4,903,754 | 2/1990 | Hirscher et al. . | |
| 4,945,856 | 8/1990 | Stewart . | |
| 4,957,781 | 9/1990 | Kanegae et al. . | |
| 5,002,011 | 3/1991 | Ohmine et al. . | |
| 5,007,372 | 4/1991 | Hattori et al. . | |
| 5,015,503 | 5/1991 | Varrin, Jr. et al. . | |
| 5,078,091 | 1/1992 | Stewart . | |
| 5,078,851 | 1/1992 | Nishihata et al. . | |
| 5,079,045 | 1/1992 | Luhmann et al. . | |
| 5,088,444 | 2/1992 | Ohmine et al. . | |
| 5,091,207 | 2/1992 | Tanaka . | |
| 5,112,642 | 5/1992 | Wajid . | |
| 5,121,707 | 6/1992 | Kanoo . | |
| 5,123,375 | 6/1992 | Hansen . | |
| 5,129,360 | 7/1992 | Ahern et al. . | |
| 5,131,752 | 7/1992 | Yu | 427/10 |
| 5,151,133 | 9/1992 | Ohmine et al. . | |
| 5,167,717 | 12/1992 | Boitnott . | |
| 5,186,120 | 2/1993 | Ohnishi et al. . | |
| 5,217,755 | 6/1993 | Thebault et al. . | |
| 5,221,403 | 6/1993 | Nozawa et al. . | |
| 5,228,501 | 7/1993 | Tepman et al. . | |
| 5,248,370 | 9/1993 | Tsui et al. . | |
| 5,248,380 | 9/1993 | Tanaka . | |
| 5,250,092 | 10/1993 | Nakano . | |
| 5,250,323 | 10/1993 | Miyazaki . | |
| 5,254,171 | 10/1993 | Hayakawa et al. . | |
| 5,261,963 | 11/1993 | Basta et al. . | |
| 5,262,194 | 11/1993 | Bischer, Jr. et al. . | |
| 5,264,039 | 11/1993 | Gobush et al. . | |
| 5,266,118 | 11/1993 | Mitra . | |
| 5,268,033 | 12/1993 | Stewart . | |
| 5,268,202 | 12/1993 | You et al. . | |
| 5,270,266 | 12/1993 | Hirano et al. . | |
| 5,292,554 | 3/1994 | Sinha et al. . | |
| 5,302,767 | 4/1994 | Galley et al. . | |
| 5,324,540 | 6/1994 | Terada . | |
| 5,344,492 | 9/1994 | Sato et al. . | |
| 5,350,453 | 9/1994 | Schlosser . | |
| 5,401,316 | 3/1995 | Shiraishi et al. . | |
| 5,439,525 | 8/1995 | Peichl et al. . | |
| 5,447,799 | 9/1995 | Loh et al. . | |
| 5,458,687 | 10/1995 | Shichida et al. . | |
| 5,534,068 | 7/1996 | Beach et al. . | |

CONTINUOUS VAPOR DEPOSITION APPARATUS

This application is a continuation of application Ser. No. 08/449,991, filed May 25, 1995, now abandoned, which is a divisional application of application Ser. No. 08/129,291 filed on Sep. 30, 1993 now U.S. Pat. No. 5,424,097.

FIELD OF THE INVENTION

The present invention relates to apparatus and processes for coating objects with a coating material by vapor deposition. More specifically, the present invention relates to a continuous vapor deposition apparatus for coating objects with a coating material, e.g., parylene, which comprises an entrance chamber, a process chamber, wherein the coating is conducted, and an exit chamber, and a process suitable for use in the apparatus.

BACKGROUND OF THE INVENTION

Coating materials, e.g. polymers, are often used as protective barriers on circuit boards, electrical components, medical devices and the like. Parylene is a generic term often used to describe a class of poly-p-xylylenes which are derived from a dimer of the structure:

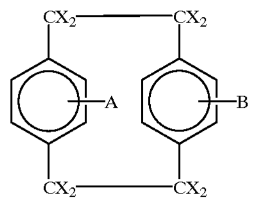

where X is typically hydrogen or a halogen, e.g., fluorine, and A and B, when present, are halogens, e.g., chlorine. Due to its ability to provide thin films and conform to substrates of varied geometric shapes, parylene is ideally suited for use as a conformal coating.

Typically, parylene is applied by vapor deposition under vacuum conditions wherein the parylene monomer is condensed and polymerized directly on the surface of the object to be coated. Since the parylene monomer is not stable, the parylene dimer, as illustrated above, is used as the starting material.

Typical apparatus for carrying out parylene vapor deposition coating processes are configured to perform the coating processes in a batch mode and comprise: a vaporization zone, wherein the parylene dimer is vaporized; a pyrolysis zone, wherein the parylene dimer is pyrolyzed, i.e., heated and cleaved, to its monomeric form; a deposition chamber, wherein the objects to be coated are exposed to the parylene monomer; and a vacuum means for maintaining vacuum conditions within the deposition chamber.

Performing the coating processes in the batch mode requires that the objects be placed into the deposition chamber prior to creating a vacuum in the deposition chamber. Thus, the batch processes cannot be readily integrated with other manufacturing steps, i.e., in line processing. As a result, it is often necessary to handle the objects, both prior to and subsequent to the coating process. Care must be taken in such handling steps to avoid contamination or impurities which may lead to imperfections in the parylene coating step or subsequent processing steps. In addition, since the coating step cannot be readily conducted before the deposition chamber has reached the desired vacuum pressure, there can often be a significant process down time, i.e., period of time when coating is not be conducted. The coating time efficiency can be low, e.g., 40 to 80% of the total process cycle time.

Furthermore, in a typical batch apparatus the pressure within the deposition chamber is controlled by adjusting the heat input to the vaporization zone. Since regulating the heat input is an indirect method of pressure control, thermal lags and pressure overshoots can be encountered.

Accordingly, new continuous vapor deposition processes and apparatus are desired for coating objects with a coating material which: can be readily integrated with other manufacturing steps: would have reduced process down time in the deposition chamber and higher coating time efficiencies and would have improved process control characteristics as compared to batch processes.

SUMMARY OF THE INVENTION

In accordance with the present invention, continuous vapor deposition apparatus for coating objects with a coating material are provided. The apparatus comprises an entrance chamber, a process chamber, i.e. deposition chamber, an exit chamber, a vaporization zone, a pyrolysis zone, a vacuum means for establishing vacuum pressures in the chambers, and a means for advancing the objects sequentially from the entrance chamber to the process chamber to the exit chamber. Preferably, the apparatus further comprises a means for sensing the pressure in the process chamber and controlling the amount of coating material introduced to the process chamber in response thereto. The present invention is also directed to continuous vapor deposition processes for coating objects with a coating material which are suitable for use in the apparatus of the present invention.

By virtue of the present invention, it is now possible to coat objects with a coating material, e.g. parylene, under vacuum conditions on a continuous basis. As a result, the coating step, which is conducted in the process chamber, can be conducted on a continuous basis without having down time for pressure adjustments. In addition, the apparatus and processes of the present invention can provide improved process control by modulating the amount of coating material introduced into the process chamber in response to a direct measurement of the pressure in the process chamber.

DETAILED DESCRIPTION OF THE INVENTION

Figure 1:
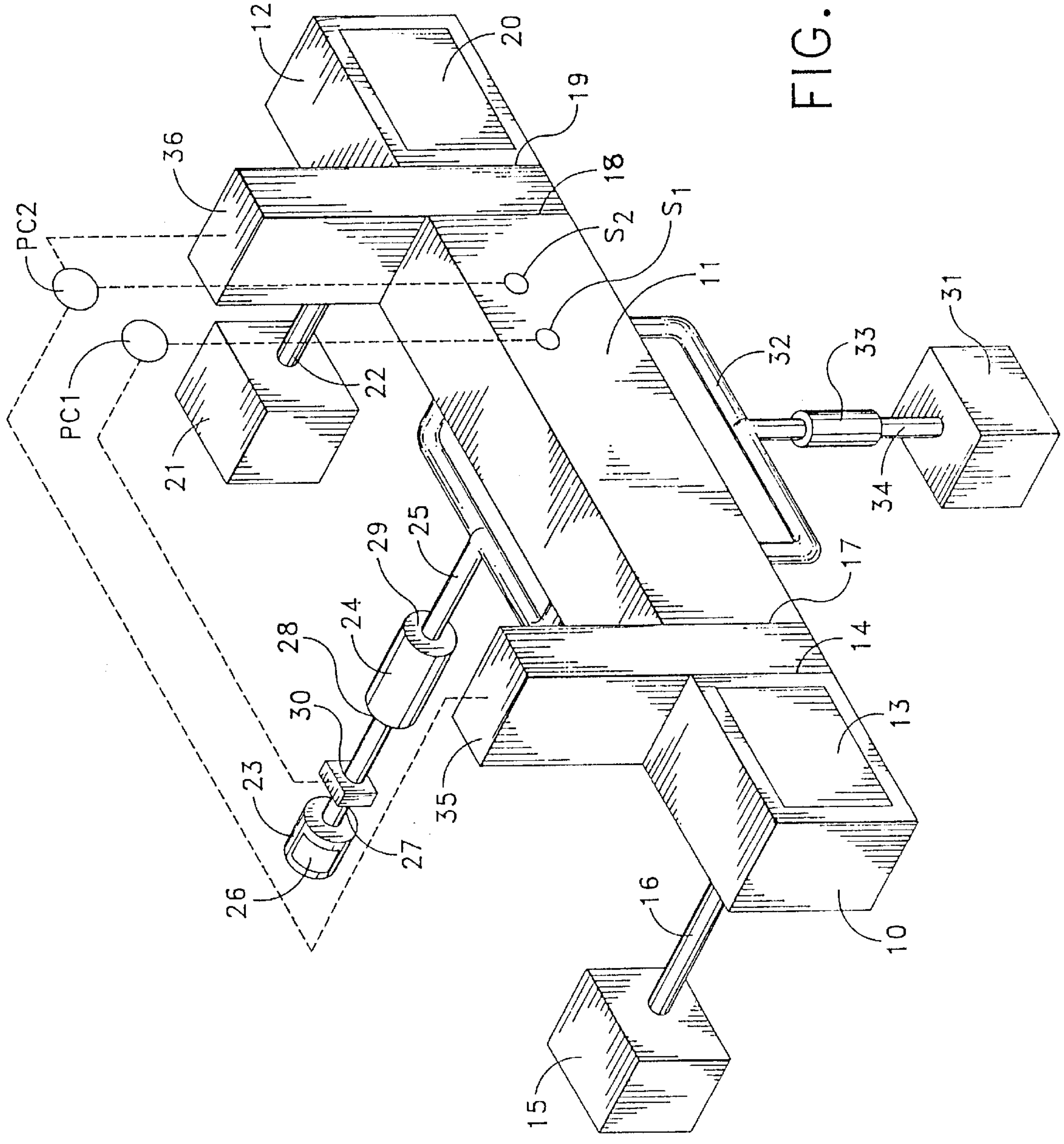
FIG. 1 is a perspective view of an apparatus in accordance with the present invention.

The particular objects being coated are not critical to the present invention. The objects can have a variety of physical geometries and sizes. Typical objects suitable for coating with the apparatus and processes of the present invention include, for example: medical products, e.g., catheters, pacemakers, surgical implants, surgical tools, etc.; electronic products, e.g., circuit boards, semi-conductors, wafers, etc.; automotive products, e.g., sensors, contacts, switches, etc.; as well as many other products which require protective coatings.

The invention is hereafter described with reference to FIG. 1 which is presented for illustrative purposes and is not intended to limit the scope of the claims which follow.

FIG. 1 illustrates a perspective view of a continuous vapor deposition apparatus for coating ojects with a coating material.

The apparatus comprises an entrance chamber 10 for introducing objects to the apparatus, a process chamber 11 wherein the objects are coated with the coating material, and an exit chamber 12 where the objects can be removed from the apparatus.

Entrance chamber 10 comprises an entrance opening 13 to which the objects can be introduced. An openable cover or lid (not shown) is also preferably provided for closing the entrance opening in entrance chamber 10. Entrance chamber 10 also comprises an exit end 14 which has an opening of sufficient size to accommodate the passage of the objects from entrance chamber 10 to process chamber 11. A vacuum pump 15 is connected to entrance chamber 10 by conduit 16 for establishing a vacuum in entrance chamber 10.

Process chamber 11 comprises an entrance end 17 having an opening of sufficient size to accommodate the passage of objects from entrance chamber 10 to process chamber 11. Process chamber 11 further comprises an exit end 18 having an opening of sufficient size to accommodate the passage of objects from process chamber 11 to exit chamber 12. Process chamber 1 may contain any desired number of stages. Preferably, process chamber 11 has from about 2 to 10 stages and more preferably, from about 3 to 6 stages. Each of the stages is preferably of a sufficient size in order to hold the contents of one load of objects in the entrance chamber. Thus, the volume of the process chamber will typically be from about 2 to 10 times the volume of the entrance chamber. Preferably, trays or fixtures (not shown) are provided for holding the object, such trays being slidably positioned in the apparatus to pass from the entrance chamber to the process chamber to the exit chamber. The process chamber may also comprise baffles or other flow distribution apparatus in order to evenly distribute the flow of coating material throughout the process chamber.

Exit chamber 12 comprises an entrance end 19 having a sufficient opening to accommodate the passage of objects from process chamber 11 to exit chamber 12. Thus, the entrance and exit ends of entrance chamber 10, process chamber 11 and exit chamber 12 are oriented to permit communication between the chambers. Exit chamber 12 further comprises an exit opening 20 from which the objects can be removed. An openable cover or lid (not shown) is also provided for closing the exit opening in exit chamber 12. A vacuum pump 21 is connected to exit chamber 12 by a conduit 22 for establishing a vacuum in exit chamber 12.

A coating material, e.g., parylene, is introduced to process chamber 11 via. vaporization zone 23, pyrolysis zone 24, and inlet manifold 25. Vaporization zone 23 has an entrance opening 26 to which the coating material can be introduced, an exit end 27 from which the vaporized coating material can be discharged, and a heating means (not shown) for vaporizing the coating material. A typical heating means comprises an electrical heating element. Pyrolysis zone 24 comprises an entrance end 28 oriented to permit communication with the exit end of the vaporization zone, an exit end 29 oriented to permit communication with the process chamber via conduit 25, and a heating means (not shown) for pyrolyzing the coating material. A typical heating means comprises an electrical heating element.

A modulation valve 30 is disposed between the exit end 27 of vaporization zone 23 and the entrance end 28 of pyrolysis zone 24. The modulation valve is positionable between at least two open positions wherein varying degrees of communication between the vaporization zone and the pyrolysis zone are provided. Preferably, modulating valve 30 is positionable within a continuous range of openings between a fully open position and a fully closed position. Ball valves are preferred modulating valves in accordance with present invention. The details concerning such valves are known to those skilled in the art. Moreover, such valves are commercially available for example, from Worcester Controls, Marlborough, Mass., and from K. J. Lesker, Clairton, Pa. Modulation valve 30 is preferably positioned, i.e., opened and closed, in response to the measurement of a characteristic from the process chamber, e.g., pressure, temperature, etc., from sensor S1, which is inputed to process controller PC1 which then in turn regulates the position of modulation valve 30. The details concerning the techniques and apparatus for such process control are known to those skilled in the art.

The apparatus also comprises a vacuum pump 31 which is connected to process chamber 11, via, exit manifold 32, cold trap 33, and conduit 34. The function of cold trap 33 is to condense residual vapors of coating material, e.g., parylene, as well as other condensible vapors, e.g, water vapor, present in the gas withdrawn from the process chamber prior to entering vacuum pump 31. Cold trap 33 comprises an appropriate cooling means, e.g., liquid nitrogen, to condense the vaporized coating material. The details concerning the techniques and apparatus for such vapor condensation are known to those skilled in the art.

An entrance gate valve 35 is disposed between the exit end of entrance zone 10 and the entrance end of process zone 11. The entrance valve is positionable between an open position wherein communication between the entrance chamber and the process chamber is provided and a closed position wherein such communication is terminated. Similarly, an exit valve 36 is disposed between the exit end of process chamber 11 and the entrance end of exit chamber 12. The exit valve is positionable between an open position wherein communication between the process chamber and the exit chamber is provided and a closed position wherein such communication is terminated.

Preferably, entrance valve 35 and exit valve 36 are heated by a heating means, e.g., an electric heating element, in order to inhibit the condensation of vaporized coating material thereon. Other elements of the apparatus, e.g, manifolds, baffles, and the like, may also be heated if desired.

The apparatus also comprises a means for advancing the objects, preferably, sequentially, from entrance chamber 10 to process chamber 11 to exit chamber 12. Preferably, the advancing means comprises a pushing assembly and a pulling assembly. Preferably, the pushing assembly (not shown) is housed inside the entrance chamber and comprises a push arm which is slidably attached to a guide shaft, or more preferably attached to a rodless cylinder. Similarly, the pulling assembly (not shown), is preferably housed in the exit chamber and comprises a rake, e.g. hook, sidably attached to a guide shaft, or more preferably attached to a rodless cylinder. The details concerning such pushing assemblies and pulling assemblies, including rodless cylinders, are known to those skilled in the art.

Preferably, the apparatus further comprises a second sensing means S2 for sensing the amount of the coating material applied to the objects. The particular sensing means is not critical to the present invention and may include, for example, a thermal conductivity device which can measure the thermal conductivity of a test strip. As the test strip is coated with varying amounts of coating material, the thermal conductivity of the test strip will change. Other thickness sensing methods may include, for example, optical measurements, acoustic response measurements and capacitance measurements may also be employed. A signal from the second sensing means is then preferably passed to a second process controller, i.e., PC2, which then functions to open entrance valve 35 and exit valve 36 and advance each chamber of coated objects having the desired thickness level from the process chamber to the exit chamber and uncoated objects from the entrance chamber to the process chamber. The details concerning such process control techniques and apparatus are known to those skilled in the art. A suitable process controller is, for example, a SLC-500 programnable controller available from Allan Bradley, Milwaukee, Wis. Although FIG. 1 illustrates two process controllers, i.e., PC1 and PC2, those skilled in the art will recognize that both process control functions can be readily conducted in a single process control apparatus.

The materials of construction of the apparatus of the present invention, are not critical. Typically, the apparatus will be comprised of metal, e.g., steel, aluminum and other alloys. The various elements of the apparatus, can be attached to each other by any means known to those skilled in the art, such as, for example, welding, bolting, and the like. Preferably, the entrance chamber, process chamber, exit chamber, entrance and exit valves are removably attached to each other, e.g., with bolts, and separated by an appropriate gasketing material, e.g., elastomers such as Viton, suitable for maintaining the vacuum pressures used in the apparatus.

The processes of the present invention are hereinafter described with reference to the apparatus shown in FIG. 1. In addition, the process is hereinafter described with reference to parylene as the coating material, although those skilled in the art will recognize that other polymers may exist now or in the future which are suitable for use as coating materials in the apparatus and processes of the present invention. Parylene dimer, the starting material, is commercially available from a variety of sources, e.g., Union Carbide Corporation, Danbury, Conn.

Parylene dimer is introduced to the apparatus through opening 26 in vaporization zone 23. The temperature in the vaporization zone during processing typically ranges from about 80 to about 200° C.

While the apparatus is at atmospheric pressure, process chamber 11 is loaded with objects to be coated. Typically, the objects are placed on trays or fixtures which are slidably positioned within the apparatus. After the objects are loaded into process chamber, entrance valve 35 and exit valve 36 are closed and the pressure within the process chamber is reduced to a vacuum pressure, typically from about 1 to 50 millitorr, preferably from about 10 to 50 millitorr, by vacuum pump 31. The pressure in process chamber 11 is then measured by pressure sensor S1 and modulation valve 30 is opened and closed in response to the pressure signal. As the pressure in the chamber drops, the valve opens to permit more vaporized parylene dimer to discharge from vaporization zone 23 through valve 30 and pyrolysis zone 24 into the process chamber via manifold 25. In the pyrolysis zone, the parylene dimer is pyrolyzed to form the parylene monomer. The temperature in the pyrolysis zone typically ranges from about 500 to 750° C., preferably from about 650 to 750° C. and more preferably, from about 680 to 700° C.

While coating is taking place in process chamber 11, the pressure in exit chamber 20 is reduced from atmospheric pressure to a vacuum pressure approximately equal to that in the process chamber by vacuum pump 21. Also, one or more additional objects are introduced to entrance chamber 10, via opening 13. Then opening 13 is closed and the pressure in entrance chamber 10 is reduced to a vacuum pressure approximately equal to that in process chamber 11 by vacuum pump 15.

Preferably, a coating thickness coating sensor is employed to sense the thickness of the coating on the objects in process chamber 11. Preferably, the objects are advanced in response to sensing the thickness of the coating material on the objects or objects in the process chamber, comparing the thickness with a target value, and then advancing the coated objects from the process chamber to the exit chamber when the thickness of the coating material meets or exceeds the target value. More specifically, when the desired coating thickness is achieved, modulating valve 30 is closed, entrance valve 35 and exit valve 36 are opened, and the objects are advanced through the apparatus such that the objects in the entrance chamber are advanced to process chamber and the objects closest to the exit chamber in the process chamber are advanced to the exit chamber. Then, entrance valve 35 and exit valve 36 are closed and modulating valve 30 is opened, and the coating process is continued.

The pressure in exit chamber 12 is then raised to about atmospheric pressure and the coated object or objects are removed from the exit chamber via opening 20. In addition, the pressure in entrance chamber 10 is raised to about atmospheric pressure and anuncoated object or objects are introduced via opening 13. The objects are then advanced again when the coating thickness of the objects in the process chamber reaches the desired value.

Preferably, the objects to be coated are treated with an adhesion promotion agent, e.g., silane, prior to being coated with parylene. The details concerning the use of such adhesion promotion agents are known to those skilled in the art. Quite advantageously in accordance with the present invention, the adhesion promotion step can be the entrance chamber instead of in the process chamber, i.e., deposition chamber, as in typical batch processes. This feature of the present invention can result in a more efficient application of the parylene and makes cleaning the apparatus far easier since less parylene deposits on the internal surfaces of the process chamber of the present invention as compared to the deposition chamber of a batch apparatus. More specifically, in typical batch processes, the adhesion promotion agent is introduced to the deposition chamber to pre-coat the objects prior to coating with parylene. Thus, the adhesion promotion agent also gets on the internal surfaces of the process chamber. Hence, when the parylene is introduced during a typical batch process, it can adhere quite strongly to the internal surfaces of the deposition chamber due to the presence of the adhesion promotion agent. Accordingly, in accordance with the presence invention, less parylene often forms on the internal surfaces of the process chamber as compared to a typical batch apparatus. Therefore, the recovery of parylene, i.e., percentage of parylene starting material deposited on the objects, is preferably enhanced over the recovery of a batch process. More preferably, the parylene recovery is at least about 50 weight percent and most preferably at least about 75 weight percent.

Although the invention has been described with respect to specific aspects, those skilled in the art will recognize that modifications and alterations thereof are intended to be included within the scope of the claims which follow. For example, in the process of the present invention, it may be desirable to correlate the coating thickness to the integral of the pressure over the residence time in the process chamber rather than to measure the thickness directly. Similarly, it may be desirable to initiate the process by loading objects into the entrance chamber and passing the objects into the process chamber rather than to initially load the process chamber. Also, in the apparatus of the present invention, other means for performing the various functions described herein may be employed. For instance, the pushing and pulling assemblies may be replaced by a conveyor assembly. In addition, although FIG. 1 illustrates three vacuum pumps, i.e., vacuum pump 15, 21 and 31, those skilled in the art will recognize that fewer than three vacuum pumps, e.g., one vacuum pump, or a vacuum pump with multiple stages or other vacuum means, e.g., venturi suction, can be employed.

We claim:

1. A continuous vapor deposition apparatus for coating objects, comprising:

an entrance chamber including an entrance opening through which said objects can be introduced to said entrance chamber, and further including an exit end;

a process chamber including an entrance end oriented to permit communication with the exit end of said entrance chamber and further including an exit end;

an exit chamber including an entrance end oriented to permit communication with the exit end of said process chamber, and further including an exit opening from which said objects can be removed from said exit chamber;

an entrance gate valve disposed between the exit end of the entrance chamber and the entrance end of the process chamber, said entrance gate valve being selectively positionable between an open position wherein communication between the entrance chamber and the process chamber is provided and a closed position wherein said communication is terminated;

an exit gate valve disposed between the exit end of the process chamber and the entrance end of the exit chamber, said exit gate valve being selectively positionable between an open position wherein communication between the process chamber and the exit chamber is provided and a closed position wherein said communication is terminated;

a vaporization zone having an opening through which a solid material may be introduced into said vaporization zone, an exit end, and a heater for vaporizing said solid material to form a gaseous material, a pyrolysis zone having an entrance end oriented to permit communication with the exit end of the vaporization zone, and an exit end oriented to permit communication with the process chamber, and a heater for pyrolyzing said gaseous material to form a pyrolyzed gaseous material;

a modulation valve disposed between the exit end of the vaporization zone and the entrance end of the pyrolysis zone, said modulation valve being positionable between at least two positions wherein varying degrees of fluid communication between the vaporization zone and the process chamber are provided;

a pressure sensor for sensing a pressure in said process chamber;

a first control apparatus for adjusting said position of said modulation valve in response to said pressure in said process chamber;

a thickness sensor for sensing a thickness of the pyrolyzed gaseous material deposited on said objects; and a second control apparatus in association with said thickness sensor for controlling a position of said entrance and exit gate valves.

2. In the apparatus of claim 1, said modulation valve being positionable between a continuous range of openings between a fully open position and a fully closed position.

3. The continuous vapor deposition apparatus according to claim 2, wherein the entrance gate valve is adjacent to the entrance end of the process chamber and the exit gate valve is adjacent to the exit end of the process chamber.

4. The continuous vapor deposition apparatus according to claim 3, wherein the process chamber has from two to ten stages.

5. The continuous vapor deposition apparatus according to claim 3, wherein the process chamber has from three to six stages.

6. The continuous vapor deposition apparatus according to claim 2, wherein the process chamber has a volume that is from two to ten times a volume of the entrance chamber.

7. The continuous vapor deposition apparatus according to claim 1, wherein the entrance gate valve is adjacent to the entrance end of the process chamber and the exit gate valve is adjacent to the exit end of the process chamber.

8. The continuous vapor deposition apparatus according to claim 1, wherein the process chamber has from two to ten stages.

9. The continuous vapor deposition apparatus according to claim 1, wherein the process chamber has from three to six stages.

10. The continuous vapor deposition apparatus according to claim 1, wherein the process chamber has a volume that is from two to ten times a volume of the entrance chamber.

11. A continuous vapor deposition apparatus, comprising:

a process chamber for receiving an object to be coated;

a vaporization zone having an opening through which a solid material may be introduced into said vaporization zone, an exit end, and a heater for heating said solid material in said vaporization zone to form a gaseous material;

a pyrolysis zone having an entrance end in communication with the exit end of the vaporization zone, an exit end oriented to permit communication with the process chamber, and a heater for pyrolyzing said gaseous material to form a pyrolyzed gaseous material;

a first sensor in communication with said process chamber for measuring a thickness of the coating on the object;

an entrance gate valve having an open position and a closed position, the entrance gate valve sealing the process chamber when the entrance gate valve is in the closed position, the entrance gate valve being prevented from sealing the process chamber when the entrance gate valve is in the open position;

an exit gate valve having an open position and a closed position, the exit gate valve sealing the process chamber when the exit gate valve is in the closed position, the exit gate valve being prevented from sealing the process chamber when the exit gate valve is in the open position; and a first control apparatus in association with said first sensor for controlling a position of said entrance and exit gate valves.

12. The continuous vapor deposition apparatus of claim 11, further comprising a modulation valve, a second control apparatus and a pressure sensor for sensing a pressure in the process chamber, wherein said modulation valve is positionable between two positions, each of the two positions of the modulation valve providing a different amount of fluid communication between the vaporization zone and the process chamber, and wherein said second control apparatus is capable of controlling a position of said modulation valve responsive to pressure within said process chamber by the pressure sensor.

13. The continuous vapor deposition apparatus of claim 12 wherein said modulation valve is positionable through a continuous range of openings between a fully open position and a fully closed position.

14. The continuous vapor deposition apparatus according to claim 13, further comprising an entrance chamber and an exit chamber, the entrance chamber having an exit end located adjacent to the entrance gate valve, the exit chamber having an entrance end located adjacent to the exit gate valve.

15. The continuous vapor deposition apparatus according to claim 14, wherein the process chamber has a volume of two to ten times a volume of the entrance chamber.

16. The continuous vapor deposition apparatus according to claim 11, wherein the process chamber has two to ten stages.

17. The continuous vapor deposition apparatus according to claim 11, wherein the process chamber has two to ten stages.

18. The continuous vapor deposition apparatus according to claim 11, further comprising an entrance chamber and an exit chamber, the entrance chamber having an exit end located adjacent to the entrance gate valve, the exit chamber having an entrance end located adjacent to the exit gate valve.

19. The continuous vapor deposition apparatus according to claim 18, wherein the process chamber has a volume of two to ten times a volume of the entrance chamber.

20. The continuous vapor deposition apparatus of claim 11 wherein said modulation valve is positionable through a continuous range of openings between a fully open position and a fully closed position.

* * * * *

UNITED STATES PATENT AND TRADEMARK OFFICE

CERTIFICATE OF CORRECTION

PATENT NO. : 5,908,506

DATED : June 1, 1999

INVENTOR(S) : Olson, et al

It is certified that error appears in the above-identified patent and that said Letters Patent is hereby corrected as shown below:

Claim 17 should be corrected as follows:

--The continuous vapor deposition apparatus according to claim 11, wherein the process chamber has [two] three to [ten] six stages.--

Signed and Sealed this

Thirtieth Day of May, 2000

Attest:

Q. TODD DICKINSON

*Attesting Officer* *Director of Patents and Trademarks*